(12) United States Patent
Steffen et al.

(10) Patent No.: US 9,226,393 B2
(45) Date of Patent: Dec. 29, 2015

(54) TEAR-PROOF CIRCUIT

(71) Applicant: STMicroelectronics (Rousset) SAS, Rousset (FR)

(72) Inventors: Francis Steffen, Saint Maximin (FR); Gilbert Assaud, Marseilles (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/512,179

(22) Filed: Oct. 10, 2014

(65) Prior Publication Data

US 2015/0029275 A1    Jan. 29, 2015

Related U.S. Application Data

(60) Division of application No. 12/696,829, filed on Jan. 29, 2010, now Pat. No. 8,867,217, which is a continuation-in-part of application No. PCT/IB2008/001888, filed on Jul. 14, 2008.

(30) Foreign Application Priority Data

Jul. 31, 2007   (FR) ...................................... 07 05600

(51) Int. Cl.
| | |
|---|---|
| B41J 2/14 | (2006.01) |
| B41J 2/175 | (2006.01) |
| H05K 1/00 | (2006.01) |
| H05K 1/02 | (2006.01) |
| G06K 19/073 | (2006.01) |
| G06K 19/077 | (2006.01) |

(Continued)

(52) U.S. Cl.
CPC ............... *H05K 1/028* (2013.01); *B41J 2/1753* (2013.01); *B41J 2/17546* (2013.01); *B41J 2/17559* (2013.01); *G06K 19/0739* (2013.01); *G06K 19/07798* (2013.01); *H05K 1/0283* (2013.01); *H05K 1/0313* (2013.01); *H05K 1/118* (2013.01); *H05K 1/181* (2013.01); *H05K 3/20* (2013.01); *H05K 3/30* (2013.01); *H05K 2201/10007* (2013.01); *Y10T 29/4913* (2015.01); *Y10T 29/49128* (2015.01)

(58) Field of Classification Search
CPC .................... G06K 19/0739; G06K 19/07798; B41J 2/1753; B41J 2/17546
USPC ........ 347/50, 86, 87; 361/737, 749, 777, 778; 174/254, 260–262; 29/831, 832
See application file for complete search history.

(56) References Cited

U.S. PATENT DOCUMENTS

| | | |
|---|---|---|
| 4,764,644 A | 8/1988 | Reisman et al. |
| 6,938,978 B2 * | 9/2005 | Kosugi et al. .................... 347/19 |

(Continued)

FOREIGN PATENT DOCUMENTS

| | | |
|---|---|---|
| DE | 197 20 747 A1 | 11/1997 |
| EP | 0 710 924 A1 | 5/1996 |
| EP | 1 120 739 A2 | 8/2001 |
| WO | 2004/032044 A1 | 4/2004 |

*Primary Examiner* — An Do
(74) *Attorney, Agent, or Firm* — Seed IP Law Group PLLC

(57) ABSTRACT

A circuit including a flexible substrate and at least one electric element attached to the substrate, the substrate including at least one cavity arranged near the electric element and helping to break or distort the electric element in response to a flexion or stretching of the substrate. Application in particular is to the manufacture of tear-proof electronic micromodules.

19 Claims, 5 Drawing Sheets

(51) Int. Cl.
  *H05K 1/03* (2006.01)
  *H05K 1/11* (2006.01)
  *H05K 1/18* (2006.01)
  *H05K 3/20* (2006.01)
  *H05K 3/30* (2006.01)

(56) References Cited

U.S. PATENT DOCUMENTS 7,084,354 B2 8/2006 Boggs et al.
7,638,715 B2 12/2009 Daikuhara et al.

* cited by examiner

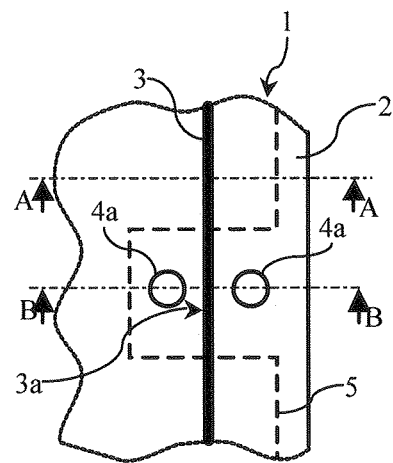
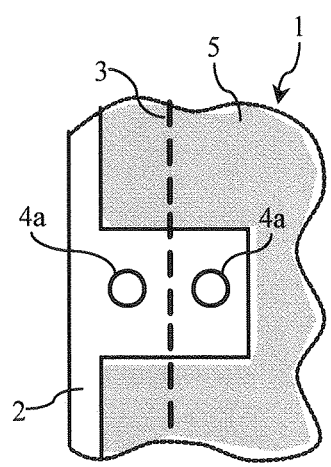
Fig. 1A
Fig. 1B
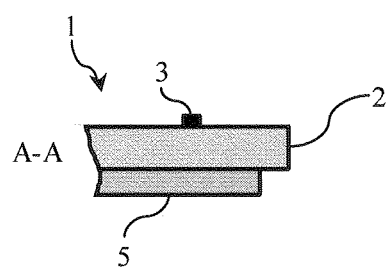
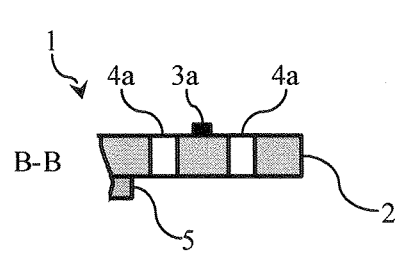
Fig. 2A
Fig. 2B
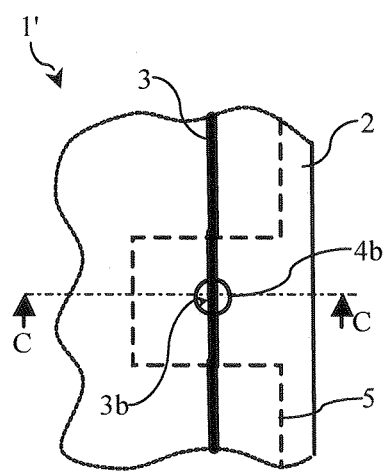
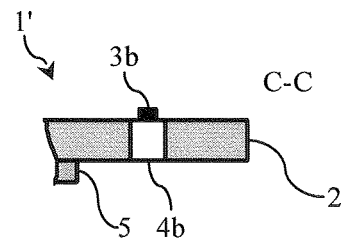
Fig. 3A
Fig. 3B

TEAR-PROOF CIRCUIT

BACKGROUND

1. Technical Field

The present disclosure relates to a flexible circuit, a micromodule made from such a circuit as well as a device utilizing such a circuit including, for example, devices having a built-in electronic circuit, such as, but not exclusively, ink cartridges.

2. Description of the Related Art

Various products like printer cartridges are usually equipped with an integrated circuit that utilize management and authentication data and are intended to communicate with a user system. The integrated circuit comes in the form of a semi-conductor chip mounted onto an interface circuit, which is glued into or onto the case of the cartridge. The interface circuit may include a flexible polymer film and conductive paths linking contact pads of the circuit to contacts of the integrated circuit.

The data contained in the integrated circuit may be indispensable for the good use of the product to which it is associated and in particular for being accepted by the user system. Thus, reusing the integrated circuit may have a technical or commercial interest, for example to make a substitution good. To that end, the interface circuit on which the integrated circuit is fixed may be torn-off and glued to a recycled or even a counterfeit case.

In some situations it is desirable to commercialize products having an integrated circuit that are not reusable.

BRIEF SUMMARY

According to one embodiment, the disclosure provides a circuit that includes a flexible substrate and at least one electric element attached to the substrate and having an electric feature, wherein the substrate has at least one cavity arranged near the electric element or a part of the electric element and helping a break of the electric element or a distortion of the electric element that causes a change in the electric feature thereof in response to a flexion or stretching or bending of the substrate.

According to one embodiment, the substrate includes at least one cavity arranged next to the electric element.

According to one embodiment, the substrate has at least two cavities arranged on each side of the electric element to form between both cavities a flexion or stretching line preferred by the substrate and helping in the break or distortion of the electric element in response to a flexion or stretching of the substrate.

According to one embodiment, the substrate includes at least one cavity arranged under the electric element so that the electric element is not supported by the substrate in the area where the cavity spreads out and has a preferred break or distortion point in this area.

According to one embodiment, the cavity is an orifice that completely passes through the substrate.

According to one embodiment, the cavity has a width or a diameter greater than a width of the electric element.

According to one embodiment, the circuit has at least one cavity forming an orifice passing through the substrate, and an electric element a part of which is captive of the distal end of a part passing through the orifice, to trigger the break of the electric element in response to the substrate moving in relation to the part passing through the cavity.

According to one embodiment, the substrate is in a polymer material.

According to one embodiment, the substrate includes at least three cavities aligned according to a flexion or stretching line preferred by the substrate.

According to one embodiment, a rear face of the substrate is covered by an adhesive layer and has a free area without an adhesive layer in an area substantially corresponding to an area in the front face where the cavity and the electric element are located.

According to one embodiment, the electric element is a conductive path or a segment of conductive path.

According to one embodiment, the electric element is a resistive, capacitive or inductive element.

An embodiment of the disclosure also relates to a micromodule including a circuit according to the disclosure, and at least one electronic component mounted onto the circuit, including at least one electric contact electrically linked to the electric element.

According to one embodiment, the electric element forms an antenna.

An embodiment of the disclosure also relates to a device including a circuit according to the disclosure and a support receiving the circuit.

According to one embodiment, the support has at least one projecting part passing through an orifice made in the circuit, and the circuit includes at least one electric element captive of the projecting part.

According to one embodiment, the device takes the shape of an ink cartridge having a case, a part of which makes the support.

An embodiment of the disclosure also relates to a method for manufacturing a circuit, including a step of making into or onto the flexible substrate at least one electric element having one electric feature, and a step of making in the substrate, near the electric element or a part thereof, at least one cavity helping the break of the electric element or the distortion of the electric element causing a change of the electric feature thereof, in response to a flexion or stretching of the substrate.

According to one embodiment, the method includes a step of making at least one cavity near the electric element.

According to one embodiment, the method includes a step of making at least two cavities on each side of the electric element to form between both cavities a flexion or stretching line preferred by the substrate and helping to break or distort the electric element in response to a flexion or stretching of the substrate.

According to one embodiment, the method includes a step of making at least one cavity under the electric element so that the electric element is not supported by the substrate in the area where the cavity spreads out and has a preferred break or distortion point in this area.

According to one embodiment, the cavity is made in the form of an orifice that completely passes through the substrate.

According to one embodiment, the method includes a step of making in the substrate at least three cavities aligned according to a flexion or stretching line preferred by the substrate.

According to one embodiment, the method includes a step of covering a rear face of the substrate with an adhesive layer, providing a free area without adhesive layer in an area substantially corresponding to an area in a front face where the cavity and the electric element are located.

According to one embodiment, the step of making the electric element includes a step of cutting a leadframe and a step of fixing the leadframe on the front face of the substrate by lamination or gluing.

According to one embodiment, the electric element is a conductive path or a segment of conductive path.

According to one embodiment, the electric element is a resistive, capacitive or inductive element.

An embodiment of the disclosure also relates to a method for manufacturing a device, including the steps of manufacturing a circuit in accordance with the method described above, and a step of gluing the rear face of the circuit onto a support using an adhesive.

According to one embodiment, the method includes a step of providing on the rear face of the substrate a free area without adhesive in order to help the break or distortion of the electric element in response to an attempt of tearing or removing the circuit off the support.

According to one embodiment, the method includes the steps of providing at least one projecting part attached to the support, making at least one corresponding orifice in the circuit, fixing the circuit onto the support so that the projecting part passes through the corresponding orifice, and making a part of an electric element captive of the projecting part, to thereby trigger the break of the electric element in response to the substrate moving in relation to the support.

According to one embodiment, the step of embedding the segment includes a step of melting two elements of the projecting part.

According to one embodiment, the method is applied to manufacturing an ink cartridge including a case, and including a step of using as support a wall of the case of the ink cartridge.

In accordance with another embodiment of the present disclosure, a device is provided that includes a flexible substrate, an electrically conductive element formed on the substrate, and at least one cavity formed in the substrate in proximity to the element to alter the conductivity of the element in response to flexion of the flexible substrate. In accordance with another aspect of the foregoing embodiment, the proximity of the cavity to the electrically conductive element includes one from among an adjacent relationship, partially under the electrically conductive element or a portion of the element, or completely under either a portion of the element or the entire element.

In accordance with another aspect of the foregoing embodiment, the at least one cavity includes two cavities, one formed on each side of the element. Ideally, these cavities are positioned to be in as close proximity to each other as possible without undercutting or overlapping the element. However, the two cavities can be positioned such that a line passing through a center of both cavities forms an angle of other than 90 degrees with respect to an axis of the element. In addition, the two cavities can be formed so that one or both partially undercut in whole or in part the element or a portion of the element.

In accordance with another aspect of the foregoing embodiment, the conductive element has at least a portion that is formed over the cavity so that the portion formed over the cavity is unsupported by the substrate.

In accordance with another aspect of the foregoing embodiment, the conductive element has at least a portion passing through an orifice formed by the at least one cavity.

In accordance with another aspect of the foregoing embodiment, the device includes a projecting part extending through the orifice, the extending part attached to at least a portion of the element and configured to alter the conductivity of the element in response to flexion of the substrate.

BRIEF DESCRIPTION OF THE SEVERAL VIEWS OF THE DRAWINGS

Example embodiments of the disclosure will be described hereinafter. These examples are described in relation with, but not limited to the appended figures wherein:

FIG. 1A is a partial top view of an embodiment of a circuit according to the disclosure;

FIG. 1B is a partial view from below of the circuit of FIG. 1A;

FIGS. 2A, 2B are partial section views according to different section axes of the circuit of FIG. 1A;

FIG. 3A is a partial top view of another embodiment of a circuit according to the disclosure;

FIG. 3B is a partial section view of the circuit of FIG. 3A;

DETAILED DESCRIPTION

Figure 4A:
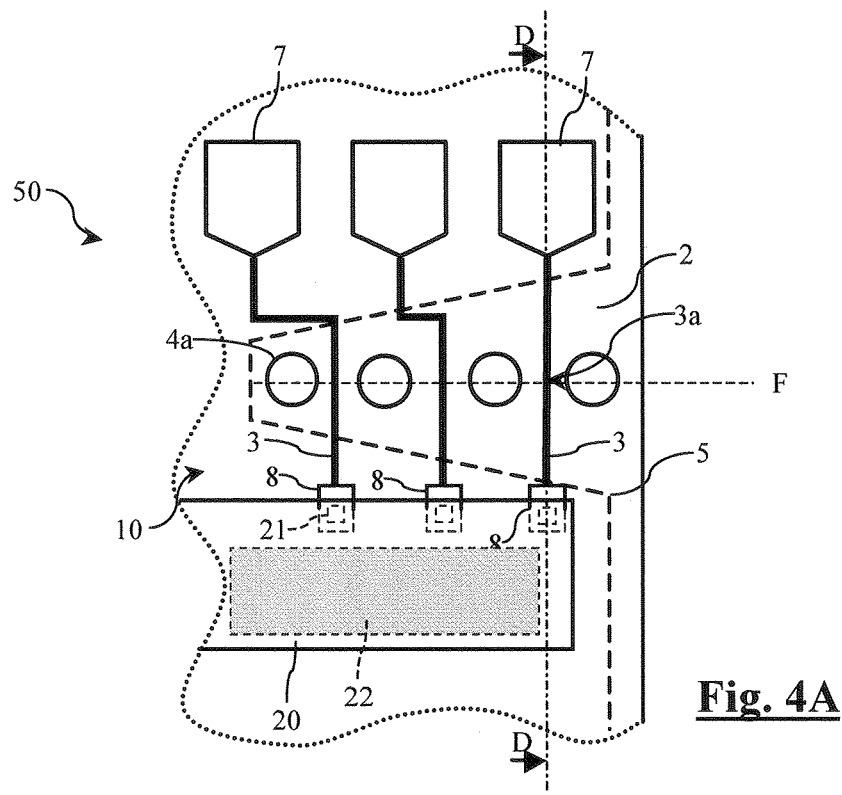
FIG. 4A is a partial top view of an embodiment of a micromodule according to the disclosure.

The embodiments of the disclosure described hereinafter provide for the altering of the conductivity of electric elements, such as by the breaking of electric elements that are in the form of conductive paths. However, the field of application of the disclosure is not limited to breaking of a conductive path. The disclosure may be applied to the destruction or simple distortion of electric elements of resistive, capacitive or inductive type to vary or alter the performance characteristics. The result may either be the destruction of a resistive, capacitive or inductive element or simply a variation of an electric feature thereof (resistance, electric capacitance or inductance) due to a distortion of the substrate on which the element is arranged. A distortion of such an element, such as by flexion, bending, twisting, stretching, compression and other mechanical stresses, can sometimes be detected visually. In addition, a variation of resistance, capacitance or inductance of such an element, as well as the manifestation of an open circuit, can be electrically detected and identified as representative of an unusual stress applied to the product concerned. Some actions may be provided after such detection, for example the hardware or software freezing of an integrated circuit connected to the electric elements that have been subjected to an unusual distortion.

FIGS. 1A and 1B are partial views of an embodiment of a circuit 1 according to the disclosure. The circuit is seen from above in FIG. 1A and from below in FIG. 1B. FIG. 2A is a section view of the circuit according to a section axis AA and FIG. 2B is a section view of the circuit according to a section axis BB.

The circuit 1 includes a substrate 2 and at least one electrically conductive path 3 extending across the front face of the substrate 2. The substrate 2 is of flexible type and is for example in a polymer material like an epoxy or polyester resin. The path is preferably of inflexible or low-flexible type and may be metal, for example copper, or a metal alloy. The conductive path is susceptible of breaking if it is subjected to flexion or stretching beyond an elasticity threshold of the constituting material thereof.

The disclosure here is directed to the breaking of the path 3 in response to a flexion or stretching of the substrate, in order to provide a protection against removal of the circuit after it has been glued to a support. In other words, the circuit will be rendered unusable if it is torn off the original support thereof.

To that end, according to one embodiment, cavities 4a are made in the substrate 2 on each side of the path 3, for example in an area of the substrate where the path 3 forms a substantially straight segment 3a. The cavities 4a are arranged near the segment 3a and the presence thereof results in a decrease in the resistance of the substrate to flexion or stretching along a line spreading out between both cavities and passing under the conductive path 3 (corresponding to the axis BB in FIG. 1A). Such a decrease in the resistance of the substrate to flexion or stretching implies that the flexion or stretching of the conductive path 3 and will consequently aid in the breaking thereof in the considered area.

The cavities 4a are here orifices that open onto the rear face of the substrate. They may have a width or diameter greater than the width of the segment 3a and are, in any event, near enough to each other to locally weaken the substrate in flexion or stretching. The cavities 4a are for example arranged at a distance of a few hundred micrometers of one another, for example 200 to 500 micrometers. This distance may vary according to the width of the segment 3a of the conductive path and the manufacturing technique used (mechanical cut, laser, etc.).

The conductive path 3 for example has a thickness of around 10 to 80 micrometers and a width of around 20 to 100 micrometers in the case of manufacturing by etching, for example. These values may be much lower (a few hundred nanometers for example) using techniques of depositing conductive or resistive materials.

The substrate 2 for example has a thickness of some micrometers to a few hundred micrometers, for example between 15 to 200 micrometers. It is clear that the thinner the substrate, the more rapidly the desired break effect is reached. A compromise must however be reached so that the substrate has a flexibility and a resistance adapted to stretching, in order not to unintentionally break the conductive path 3 when handling the substrate or during the manufacturing thereof. Advantage may be taken of a natural wear by time or environmental effect on a material, which aging features and proximity of cavities allow it to be naturally weakened. The path segment 3a has here the same width as the remainder of the conductive path 3 but may also be thinner in order to help the break thereof.

As shown in FIG. 1B, the rear face of the substrate 2 is covered by an adhesive layer 5 allowing the substrate to be glued to a support (some embodiments of support will be described hereinafter). The adhesive layer 5 is for example a double-sided adhesive film sensitive to pressure (a PSA adhesive i.e., "Pressure Sensitive Adhesive"), a glue of cyanoacrylate type or a technical glue of the type commercialized under the trademark Hotmelt®. The adhesive layer has for example a thickness of around a few micrometers to around one hundred micrometers.

According to an aspect of the disclosure, the rear face of the substrate 2 has a free area without adhesive layer 5. This free area, indicated by a dotted line in FIG. 1A, corresponds to an area on the front face of the substrate where the path segment 3a and the cavities 4a spread out. This free area locally helps the flexion or stretching of the substrate when it is unglued from a support, in a way that will clearly appear below.

Various conventional techniques may be used to attach the conductive path 3 to the substrate 2. The path may be assembled to the substrate by hot lamination or be fixed thereon using an adhesive layer. If a fixing technique with adhesive is used, it should be checked that the adhesive does not oppose to the breaking effect described in this disclosure. However, the adhesive layers used in microelectronics are usually very thin and do not provide any reinforcement action that may delay or prevent the conductive path 3 from breaking in response to a flexion or stretching of the substrate.

FIGS. 3A, 3B partially show, respectively in top and section views, another embodiment of a circuit 1' according to the disclosure. In this example, the substrate 2 has a cavity 4b that opens under a segment 3b of the conductive path 3, directly below it. The path segment 3b thus extends across the hollowness and is not supported by the substrate. The cavity 4b creates a flexion or stretching point that concentrates the bending stress on the substrate in that area and consequently forms a break point for the conductive path 3.

Figure 4B:
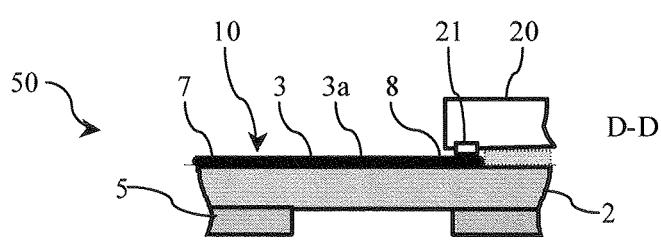
FIG. 4B is a section view of the micromodule of FIG. 4A.

FIG. 4A is a partial top view of an embodiment of a micromodule 50 according to the disclosure. FIG. 4B is a section view of the micromodule 50 according to a section axis DD in FIG. 4A. The micromodule 50 includes a circuit 10 on which a semi-conductor chip 20 is mounted. The front face of the chip 20 has contacts 21 and an active area 22 where an integrated circuit is embedded (no details).

The circuit 10 includes a substrate 2, conductive paths 3, cavities 4a, conductive pads 7, and conductive pads 8. The pads 7 provide surface contacts, accessible from outside that allow the micromodule 50 to be connected to external circuitry. Each pad 7 is here electrically linked to a pad 8 through a conductive path 3. In addition, the pads 8 are electrically linked to contacts 21 of the chip 20. Here they are directly welded on the pads 8 according to the flip-chip mounting technique, the front face of the chip 20 being directed toward the circuit 10. Alternately, the contacts 21 may be glued on the pads 8 using electrically conductive glue.

As described above in relation to FIGS. 1A, 1B, the cavities 4a are arranged on each side of the paths 3, preferably in an area where they make substantially straight segments 3a. The cavities are here arranged according to a flexion or stretching line F preferred by the substrate, helping to break all or some of the path segments 3a in response to a global flexion of the substrate or a stretching thereof or both flexion and stretching. As previously, the rear face of the substrate 2 is covered by an adhesive layer 5 and has a free area corresponding, on the front face of the substrate, to the area where the cavities 4a and the segments 3a spread out, i.e., an area corresponding to the flexion or stretching line F preferred by the substrate.

Figure 4C:
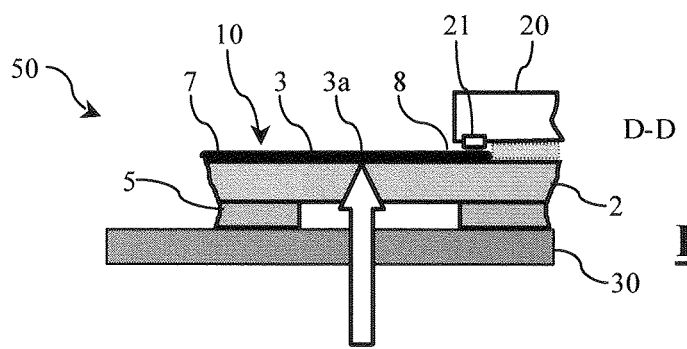
FIG. 4C shows the micromodule of FIG. 4A fixed onto a support.

FIG. 4C shows the micromodule 50 glued to a support 30 in the section view according to the section axis DD. The section axis DD is here aligned with one of the conductive paths 3 and is perpendicular to the flexion or stretching line F preferred by the substrate. The line F, here seen in the section view, thus makes a point indicated by an arrow. An attempt to tear off the circuit 10 from the support 30 causes a flexion and a stretching effect that creates distortions of greater amplitude near the cavities 4a, which lead to the breaking of all or some of the path segments 3a. Thus, an attempt at tearing off the circuit 10 partially destructs it. In other words, breaking of the conductive path segments 3a results in loss of electrical conductivity and hence a loss of circuit functionality.

The lack of the adhesive layer 5 directly below the segments 3a also helps in the breaking of the paths. Indeed, during ungluing of the substrate, a stress of certain intensity must be applied to break the adhesive layer 5. When the free area is reached, the tear-off movement accelerates and the energy freed causes a stretching of the substrate and the breaking of the conductive paths.

Figure 5A:
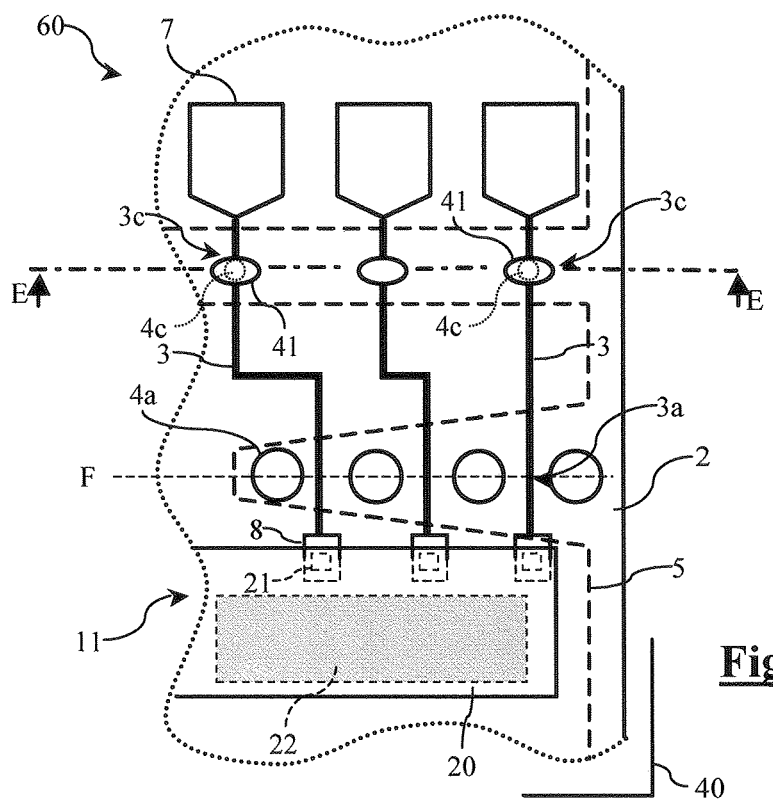
FIG. 5A is a partial top view of another embodiment of a micromodule according to the disclosure, mounted onto a support.
Figure 5B:
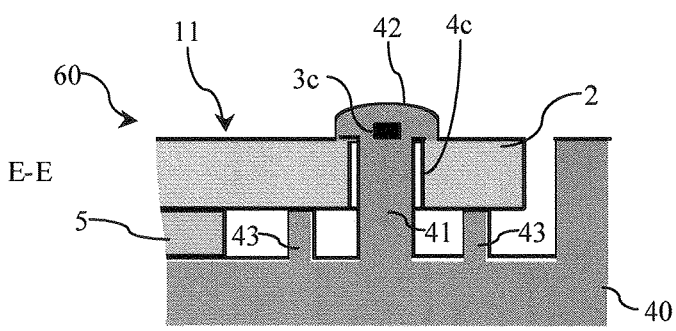
FIG. 5B is a partial section view of the micromodule of FIG. 5A and the support.

FIG. 5A is a partial top view of another embodiment of a micromodule 60 according to the disclosure, the micromodule 60 being shown arranged on a support 40. FIG. 5B is a section view of the micromodule according to a section axis EE. Like the micromodule 50, the micromodule 60 includes a circuit 11 on which a semi-conductor chip 20 including contacts 21 and an active area 22 is mounted. As previously, the circuit 11 includes a substrate 2, conductive paths 3, cavities 4a and conductive pads 7 linked to conductive pads 8 through conductive paths 3. The contacts 21 of the chip 20 are connected to the pads 8 the same way as previously (flip-chip mounting). In addition, the cavities 4a are arranged one on each side of the path segments 3a, according to a flexion or stretching line F preferred by the substrate.

According to another aspect of the disclosure, orifices 4c are made in the substrate 2, directly below the conductive paths 3, in an area where they form segments 3c different from the segments 3a. Projecting parts 41 attached to the support 40 pass through the orifices 4c and have, at the distal end thereof, bumps 42 making the segments 3c captive, as it is shown in FIG. 5B. The support 40 further includes blocks 43 near the projecting parts 41, against which the rear face of the substrate 2 leans.

Figure 6:
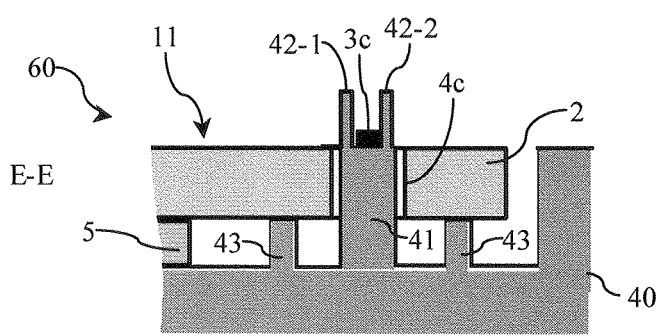
FIG. 6 shows a step of assembling the micromodule of FIG. 5A onto the support.

FIG. 6 shows a step in the formation of a bump 42 during the assembly of the micromodule 60 on the support 40. The distal end of each projecting part 41 initially includes two parallel walls 42-1 and 42-2 determining a groove in which a path segment 3c is located. The walls 42-1, 42-2 are then softened using a heating instrument (thermode) or any other means (for example a flow of warm air), causing them to melt and make the bump 42. The projecting parts and the bumps thereof 42 thus form kinds of rivets that irreversibly make the path segments 3c captive, so that any attempt at tearing the substrate 2 off the support 40 immediately causes the destruction of the path segments 3c.

On the rear face of the substrate 2, the adhesive layer 5 previously described may be provided to maintain the micromodule 60 on the support 40. It also makes it possible to suppress mechanical stress that may be exerted on the path segments 3c if the substrate was not solidly upheld on the support. As previously, the adhesive layer 5 may have free areas, in particular in an area corresponding to the area on the front face including the cavities 4a and the segments 3a, as well as in the area where the orifices extend out.

Those skilled in the art will note that other means for upholding the micromodule 60 on the support 40 may be provided here. For example, the use of rivets like the one described above may be generalized, included in the areas of the substrate where the conductive paths do not run.

In summary, a circuit or a micromodule protected against tear-off according to the ideas and principles of the disclosure may have at least one of the following features:
- at least one cavity 4a formed near a conductive path, or several cavities arranged near several conductive paths, possibly according to one or more flexion or stretching lines preferred by the substrate,
- at least one cavity spreading out under a conductive path, making a flexion or stretching point preferred by the substrate, or several cavities formed under the same or under several conductive paths, possibly according to one or more flexion or stretching lines preferred by the substrate,
- at least one path segment 3c trapped in a projecting part 41 passing through the substrate,
- an adhesive layer having free areas in flexion or stretching areas preferred by the substrate.

The disclosure may be applied to any type of circuit having a flexible substrate. A micromodule according to the disclosure may include several other semi-conductor chips or may not include any. A micromodule according to the disclosure may for example only include discrete components mounted onto the circuit, like resistors, capacitors, transistors, etc.

In addition, the support 30, 40 schematically shown in FIGS. 4A, 4B, 5A, 5B may be any type of support and particularly an internal or external wall of a case of an electronic, mechanical, electromechanical, pneumatic device receiving an electronic micromodule and for which it is desirable that the micromodule not be reused by a third person.

Figure 7:
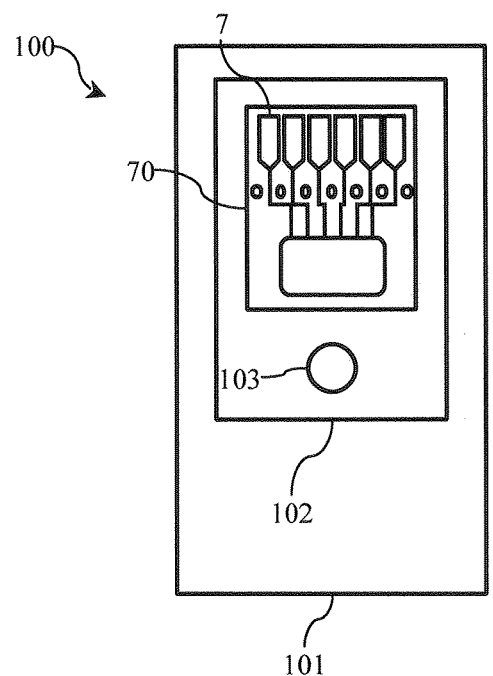
FIG. 7 schematically shows an ink cartridge including a micromodule according to the disclosure.

As an example application, FIG. 7 schematically shows in a view from below a cartridge 100 for an inkjet printer on which a micromodule 70 is fixed according to any embodiment of the disclosure. The cartridge 100 has a case 101 including an ink container. The case 101 is provided with a lower wall 102 in which an opening 103 is made to allow the ink to flow toward a printhead. The micromodule 70 is fixed onto the wall 102 through the adhesive layer described above to become a component of the cartridge. Conductive pads 7 of the micromodule make external contacts allowing the micromodule to be electrically linked to the printhead. The case 101 and particularly the wall 102 are for example in a synthetic material like polypropylene.

Figure 8:
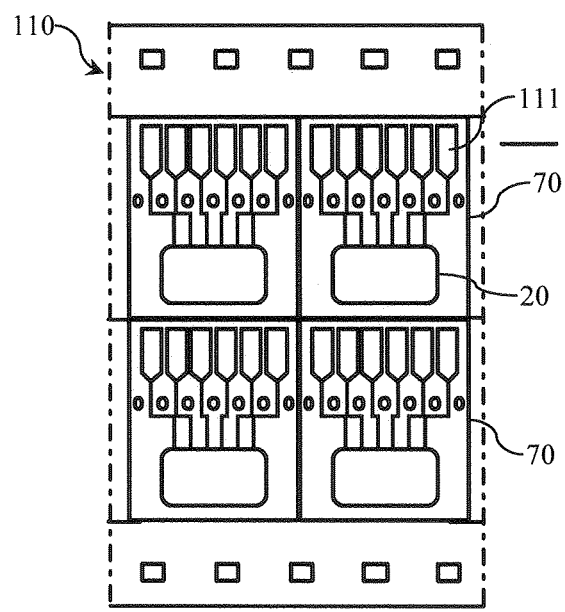
FIG. 8 shows an embodiment of a method for collectively manufacturing micromodules according to the disclosure.

FIG. 8 shows an embodiment of a method for manufacturing micromodules 70 according to the disclosure. The micromodules are here collectively manufactured from a common substrate in the form of a tape 110 which travels on a production line. Simultaneously, a metallic tape is cut, etched or stamped to make a conductive pattern 111 called leadframe which is assembled to the tape 110 by hot lamination or gluing, in order to form conductive paths and contact pads. After assembling the tape 110 and the leadframe 111, semi-conductor chips 20 are mounted onto the tape 110 with their back up (flip chip technique) and the contacts thereof are connected to contact pads of the leadframe 111.

This manufacturing method includes a step of making the cavities or orifices 4a, 4b, 4c described above. This step may be implemented before assembling the tape 110 and the leadframe 111. The cavities or orifices 4a, 4b, 4c are made by stamping, chemical etching, laser drilling of the substrate or any other known drilling method, for example using a rotary tool. The cavities 4a, 4b may also be blind and made by plastic deformation of the substrate causing a localized creep thereof.

This method may moreover be applied to the manufacture of circuits, delaying the step of mounting the integrated circuits 20 (or other electronic components); the latter may be mounted subsequently.

At the end of the manufacturing process, an adhesive layer may be deposited onto the rear face of the tape 110. This step may, however, be subsequently performed, after packaging and transporting the tape 110 to a location for manufacturing an end product. In that case, the tape 110 is covered with adhesive layer on the location of manufacture of the end product, and it is then cut to dice the micromodules 70 which are then mounted onto end products.

It will be clear to those skilled in the art that the present disclosure is susceptible of various other embodiments and applications. In particular, although it has been described above an application of the disclosure to the manufacture of a micromodule of contact type, the disclosure may also apply to the manufacture of micromodules of contactless type, for example RFID micromodules (Radiofrequency Identification) or contactless electronic tags.

Figure 9:
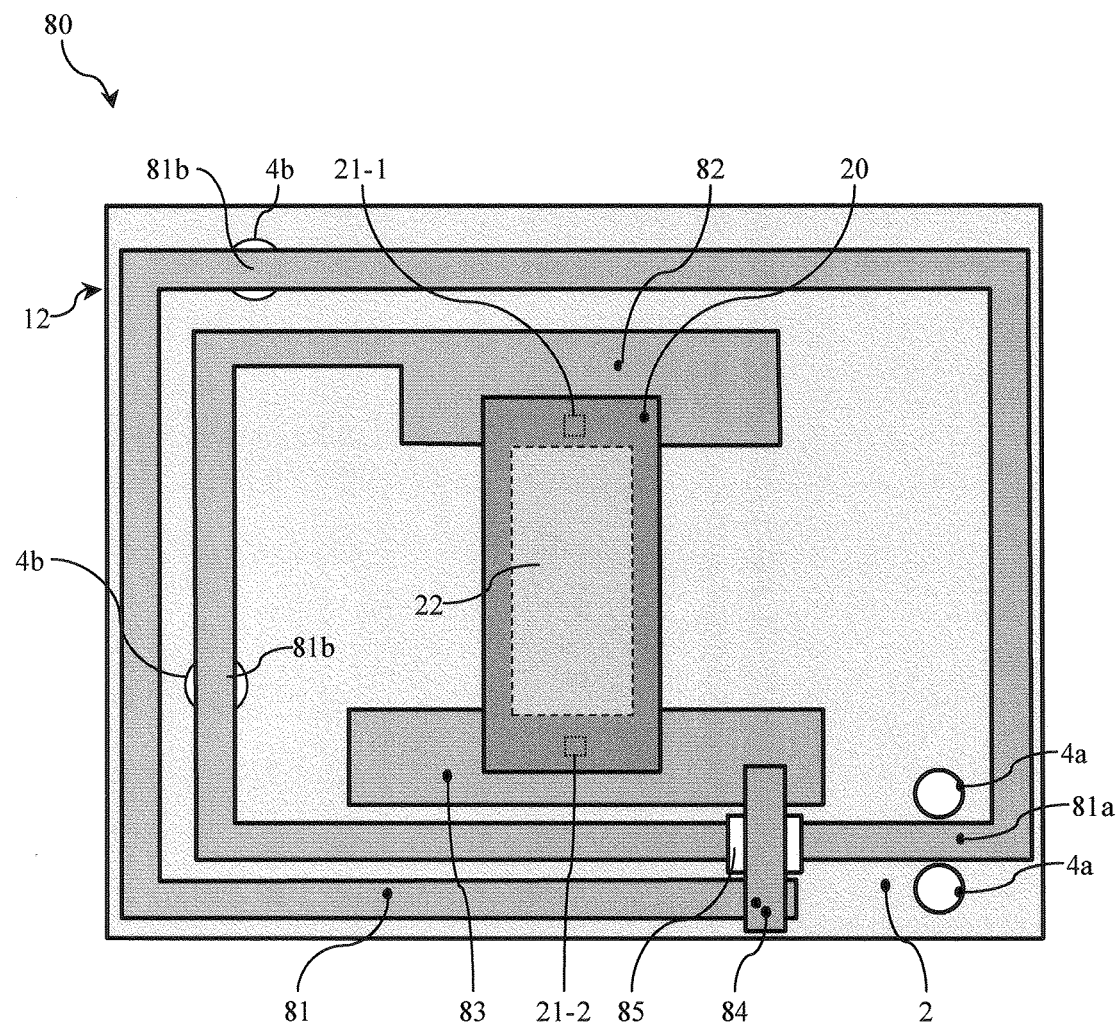
FIG. 9 is a top view of another embodiment of a micromodule according to the disclosure.

An embodiment of a contactless micromodule is shown in FIG. 9. The micromodule 80 includes a circuit 12 and a semi-conductor chip 20 including contacts 21-1, 21-2 and an active area 22 where a contactless integrated circuit operating by inductive coupling or electric coupling is embedded. The circuit 12 includes a substrate 2 and a conductive path 81 in the form of an antenna, here an antenna coil. A first contact pad 82 spreads out to a first end of the path 81, and a second contact pad 83 is linked to a second end of the path 81 by means of a conductive bridge 84 formed on an electrically insulating pad 85. The semi-conductor chip 20 is mounted with its back up, the contacts thereof 21-1, 21-2 being soldered or glued onto the pads 82, 83, respectively. The substrate 2 includes two cavities 4a arranged on each side of a first segment 81a of the path 81, and two other cavities 4b arranged directly below a second and third segment 81b of the path 81. The micromodule is glued to a support (not shown).

Tearing the micromodule 80 off the support thereof triggers the division of the path 81 at the level of one of the segments 81a, 81b after the flexion and stretching of the substrate during tear-off. Thus, the antenna no longer works and the micromodule becomes unusable. The disclosure may also be applied to capacitive elements of an antenna circuit having a tuning frequency, so that a distortion of the substrate destructs these elements or simply modifies the capacitive value thereof in order to detune the antenna circuit and make it unusable on a range of working frequencies around the tuning frequency. Eventually, the disclosure may also be applied to buried electric elements as soon as cavities made under the elements or near them make it possible to cause a distortion having a significant impact on the electric features thereof or a break thereof in response to a distortion of the substrate.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
a flexible substrate;
at least one electric element attached to the flexible substrate and having an electric feature; and
at least one cavity in the flexible substrate arranged near the electric element or near a part of the electric element, the at least one cavity forming an orifice passing through the flexible substrate,
wherein the electric element and the at least one cavity are configured to cause the electric element to break in response to the flexible substrate flexing or stretching.

2. The circuit of claim 1 wherein the flexible substrate comprises at least two cavities arranged on each side of the electric element to form between both cavities a flexion or stretching line in the flexible substrate and to form a break in or distortion of the electric element in response to a flexion or stretching of the flexible substrate.

3. The circuit of claim 1 wherein the flexible substrate comprises at least one cavity arranged under the electric element so that the electric element is not supported by the flexible substrate in the area where the at least one cavity spreads out and has a break or distortion point in this area.

4. The circuit of claim 2 wherein the at least one cavity is an orifice that completely passes through the flexible substrate.

5. The circuit of claim 1 wherein the at least one cavity has a width or a diameter greater than a width of the electric element.

6. The circuit of claim 1 wherein the flexible substrate comprises a polymer material.

7. The circuit of claim 1 wherein a rear face of the flexible substrate is covered by an adhesive layer and has a free area without the adhesive layer in an area substantially corresponding to an area in a front face where the at least one cavity and the electric element are located.

8. The circuit of claim 1 wherein the electric element comprises a conductive path or a segment of a conductive path.

9. The circuit of claim 1 wherein the electric element comprises a resistive, capacitive or inductive element.

10. The circuit of claim 1 wherein the electric element forms an antenna.

11. A device comprising:
a circuit that comprises:
a flexible polymer material;
at least one electric element attached to the polymer material and having an electric feature;
at least one cavity in the polymer material arranged near the electric element or near a part of the electric element and configured to initiate a break of the electric element or a distortion of the electric element and cause a change in the electric feature thereof in response to a flexion or stretching of the polymer material, the cavity forming an orifice passing through the polymer material, and the electric element comprising a portion that is captive in a distal end of a part passing through the orifice, to trigger the break of the electric element in response to the polymer material moving in relation to the part passing through the cavity; and
a support receiving the circuit, wherein the support has at least one projecting part passing through an orifice made in the circuit, and the circuit comprising at least one electric element captive of the projecting part.

12. The device of claim 11, comprising an ink cartridge having a case that forms a part of the support.

13. A device, comprising:
a flexible substrate;
an electrically conductive element formed on the substrate; and
at least one cavity formed in the flexible substrate in proximity to the electrically conductive element, wherein the at least one cavity and the electrically conductive element are configured to cause the electrically conductive element to break and thereby alter the conductivity of the electrically conductive element in response the flexible substrate flexing or stretching.

14. The device of claim 13 wherein the at least one cavity comprises two cavities, one cavity formed on each side of the element.

15. The device of claim 13 wherein the conductive element has at least a portion formed over the cavity that is unsupported by the flexible substrate.

16. The device of claim 13 wherein the conductive element has at least a portion passing through an orifice formed by the at least one cavity.

17. The device of claim 13, comprising a projecting part extending through the orifice formed in the at least one cavity, the extending part attached to at least a portion of the element and configured to alter the conductivity of the element in response to the substrate flexing or stretching.

18. The device of claim 13 wherein the element comprises an antenna.

19. The device of claim 13 wherein the substrate comprises a component of one from among a radio frequency identification circuit, an ink cartridge, and a contactless micromodule.

* * * * *